(12) United States Patent
Herrmann (10) Patent No.: US 9,276,138 B2
(45) Date of Patent: Mar. 1, 2016

(54) METHOD FOR PRODUCING AN OPTOELECTRONIC SEMICONDUCTOR COMPONENT, AND OPTOELECTRONIC SEMICONDUCTOR COMPONENT

(75) Inventor: Siegfried Herrmann, Neukirchen (DE)

(73) Assignee: OSRAM Opto Semiconductors GmbH (DE)

( * ) Notice: Subject to any disclaimer, the term of this patent is extended or adjusted under 35 U.S.C. 154(b) by 64 days.

(21) Appl. No.: 13/812,880

(22) PCT Filed: Jul. 13, 2011

(86) PCT No.: PCT/EP2011/061987
§ 371 (c)(1),
(2), (4) Date: Apr. 3, 2013

(87) PCT Pub. No.: WO2012/013500
PCT Pub. Date: Feb. 2, 2012

(65) Prior Publication Data
US 2013/0207155 A1    Aug. 15, 2013

(30) Foreign Application Priority Data
Jul. 30, 2010   (DE) .......................... 10 2010 032 813

(51) Int. Cl.
*H01L 31/02* (2006.01)
*H01L 27/15* (2006.01)
(Continued)

(52) U.S. Cl.
CPC ................ *H01L 31/02* (2013.01); *H01L 22/14* (2013.01); *H01L 27/153* (2013.01); *H01L 33/62* (2013.01); *H01L 33/0079* (2013.01); *H01L 2924/0002* (2013.01)

(58) Field of Classification Search
CPC ......... H01L 21/00; H01L 27/15; H01L 29/22; H01L 33/00
See application file for complete search history.

(56) References Cited

U.S. PATENT DOCUMENTS

| 6,185,240 B1 | 2/2001 | Jiang et al. |
| 2004/0075399 A1 | 4/2004 | Hall |

(Continued)

FOREIGN PATENT DOCUMENTS

| CN | 1558451 | 12/2004 |
| DE | 10 2004 058 732 A1 | 3/2006 |

(Continued)

OTHER PUBLICATIONS

Japanese Examination Report dated Dec. 24, 2013 for Japanese Application No. 2013-521052.

(Continued)

*Primary Examiner* — Lawrence-Linh T Nguyen
(74) *Attorney, Agent, or Firm* — DLA Piper LLP (US)

(57) ABSTRACT

A method of producing an optoelectronic semiconductor component includes arranging a semiconductor layer stack with a pn-junction on a substrate, lateral patterning of the semiconductor layer sack into a plurality of pairs of first semiconductor bodies and second semiconductor bodies spaced from one another in a lateral direction, detaching the substrate from the pairs of first semiconductor bodies and second semiconductor bodies, applying at least one pair of first semiconductor bodies and second semiconductor bodies to a connection carrier including electrical connection points and/or at least one conductor track, and electrically connecting the semiconductor bodies of a pair of first semiconductor bodies and second semiconductor bodies by the connection points and/or the at least one conductor track such that the pn-junction of the first semiconductor body connects in anti-parallel to the pn-junction of the second semiconductor body.

18 Claims, 8 Drawing Sheets

(51) Int. Cl.
  *H01L 33/62* (2010.01)
  *H01L 21/66* (2006.01)
  *H01L 33/00* (2010.01)

(56) References Cited

U.S. PATENT DOCUMENTS

2005/0274956 A1* 12/2005 Bhat .............................. 257/79
2006/0060880 A1* 3/2006 Lee et al. ...................... 257/99
2009/0218580 A1* 9/2009 Lin et al. ....................... 257/89
2009/0218587 A1* 9/2009 Harle et al. ................... 257/99

FOREIGN PATENT DOCUMENTS

| DE | 10 2009 006 177 A1 | 6/2010 |
| EP | 0 933 842 | 8/1999 |
| EP | 1 601 019 A2 | 11/2005 |
| JP | 2006-86489 | 3/2006 |

OTHER PUBLICATIONS

English translation of corresponding Office Action of Chinese Application No. 201180037589.7 dated Dec. 8, 2014.

* cited by examiner

METHOD FOR PRODUCING AN OPTOELECTRONIC SEMICONDUCTOR COMPONENT, AND OPTOELECTRONIC SEMICONDUCTOR COMPONENT

RELATED APPLICATIONS

This is a §371 of International Application No. PCT/EP2011/061987, with an international filing date of Jul. 13, 2011 (WO 2012/013500 A1, published Feb. 2, 2012), which is based on German Patent Application No. 10 2010 032 813.8 filed Jul. 30, 2010, the subject matter of which is incorporated herein by reference.

TECHNICAL FIELD

This disclosure provides a method for producing an optoelectronic semiconductor component and an optoelectronic semiconductor component.

BACKGROUND

There is a need to provide a method for producing an optoelectronic semiconductor component which is particularly inexpensive.

SUMMARY

I provide a method of producing an optoelectronic semiconductor component including arranging a semiconductor layer stack with a pn-junction on a substrate, lateral patterning of the semiconductor layer stack into a plurality of pairs of first semiconductor bodies and second semiconductor bodies spaced from one another in a lateral direction, detaching the substrate from the pairs of first semiconductor bodies and second semiconductor bodies, applying at least one pair of first semiconductor bodies and second semiconductor bodies to a connection carrier comprising electrical connection points and/or at least one conductor track and electrically connecting the semiconductor bodies of a pair of first semiconductor bodies and second semiconductor bodies by the connection points and/or the at least one conductor track such that the pn-junction of the first semiconductor body connects in antiparallel to the pn-junction of the second semiconductor body.

I also provide an optoelectronic semiconductor component including a connection carrier comprising electrical connection points and/or at least one conductor track, a first semiconductor body comprising a pn-junction, and a second conductor body comprising a pn-junction, wherein the first semiconductor body and the second semiconductor body are of identical structure, the first semiconductor body and the second semiconductor body are of identical thickness, the first semiconductor body and the second semiconductor body connect conductively to assigned electrical connection points, and the first semiconductor body and the second semiconductor body connect by the electrical connection points and/or the at least one conductor track such that the pn-junction of the first semiconductor body connects in antiparallel to the pn-junction of the second semiconductor body.

I further provide an optoelectronic semiconductor component including a connection carrier comprising electrical connection points and/or at least one conductor track, a first semiconductor body including a p-conducting layer, a n-conducting layer and a pn-junction, a second semiconductor body including a p-conducting layer, a n-conducting layer and a pn-junction, and a via within the first semiconductor body and a via within the second semiconductor body, wherein to electrically contact the n-conductive layer, the via extends in the first semiconductor body and in the second semiconductor body in each case through the p-conductive layer into the n-conductive layer, the first semiconductor body and the second semiconductor body are of identical structure, the first semiconductor body and the second semiconductor body are of identical thickness, the first semiconductor body and the second semiconductor body connect conductively to assigned electrical connection points, and the first semiconductor body and the second semiconductor body connect by the electrical connection points and/or the at least one conductor track such that the pn-junction of the first semiconductor body connects in antiparallel to the pn-junction of the second semiconductor body.

My method for producing an optoelectronic semiconductor component can include, in a first method step a semiconductor layer stack comprising a pn-junction arranged on a substrate. For example, the semiconductor layer stack may be deposited epitaxially on the substrate. The semiconductor layer stack preferably comprises at least one n-conductive layer and one p-conductive layer. The pn-junction may be arranged between the n-conductive layer and the p-conductive layer. The pn-junction preferably comprises at least one active region, provided to generate or detect electromagnetic radiation.

The semiconductor layer stack is based, for example, on a III-V compound semiconductor material comprising at least one element from main group three such as, for example, Al, Ga, In, and one element from main group five such as, for example, N, P, As. In particular, the term "III-V compound semiconductor material" encompasses the group of binary, ternary and quaternary compounds containing at least one element from main group three and at least one element from main group five, for example, nitride and phosphide compound semiconductors. N-conductive and p-conductive layers may respectively be produced by appropriate doping of the semiconductor material.

The substrate is, for example, a growth substrate which may in this case consist inter alia of sapphire or silicon or contain sapphire or silicon.

After its application to the substrate, the semiconductor layer stack may be patterned laterally into a plurality of pairs of first semiconductor bodies and second semiconductor bodies. Lateral patterning means that the semiconductor layer stack is divided into a plurality of pairs of first semiconductor bodies and second semiconductor bodies, the pairs being spaced laterally from one another. The lateral direction is in this case the direction which extends parallel to the outer face of the substrate on which the semiconductor layer stack is arranged.

After lateral patterning, the first and second semiconductor bodies of each pair are arranged in particular spaced relative to one another in the lateral direction, i.e. a trench is then situated between the first semiconductor body and the second semiconductor body, which trench may extend from the top, remote from the substrate, of the semiconductor layer stack as far as the substrate or as far as into the substrate. Patterning may proceed, for example, by etching of mesa trenches and/or a laser separation method. Lateral patterning of the semiconductor layer stack results in first and second semiconductor bodies each comprising a region of the pn-junction of the semiconductor layer stack, i.e. the first and second semiconductor bodies each also comprising a pn-junction. After lateral patterning, the pn-junctions of the first and second semiconductor bodies of each pair are insulated electrically from one another.

The substrate may be detached from the pairs of first and second semiconductor bodies. Detachment of the substrate may proceed after lateral patterning of the semiconductor layer stack into the plurality of pairs of first and second semiconductor bodies. Detachment may proceed, for example, by etching, sawing, grinding and/or a laser lift-off method.

At least one pair of first and second semiconductor bodies may be applied to a connection carrier. The pair of first and second semiconductor bodies may be applied before or after detachment of the substrate. The first and second semiconductor bodies of a pair are preferably applied to the connection carrier simultaneously, i.e. in the same step.

The connection carrier is, for example, a type of circuit board comprising electrical connection points and/or at least one conductor track. For example, the connection carrier comprises a ceramic main body, to the outer face of which are applied the electrical connection points and/or the at least one conductor track, for example, in the form of patterned metal coatings. The ceramic main body may in particular consist of a ceramic material such as silicon nitride, aluminium oxide or boron nitride or contain one of these ceramic materials. Furthermore, it is possible for the connection carrier to be a metal-core board or a printed circuit board, for example, also a flexible printed circuit board. The connection carrier preferably in any case comprises electrical connection points and/or at least one conductor track.

The semiconductor bodies of a pair of first and second semiconductor bodies may connect together electrically by the connection points and/or the at least one conductor track of the connection carrier such that the pn-junction of the first semiconductor body connects in antiparallel with the pn-junction of the second semiconductor body.

"Connected in antiparallel" here means that the first and second semiconductor bodies connect in parallel with one another such that the p-conductive region of the first semiconductor body electrically connects to the n-conductive region of the second semiconductor body and the n-conductive region of the first semiconductor body electrically connects to the p-conductive region of the second semiconductor body. Due to the pn-junctions, the first and the second semiconductor bodies form diodes connected in antiparallel with one another by the connection points and/or the at least one conductor track of the connection carrier. Electrical connection of the semiconductor bodies takes place with or after application to the connection carrier of a pair of first and second semiconductor bodies. Electrical connection in particular does not take place prior to application to the connection carrier. Prior to application to the connection carrier, the pn-junctions of the first and second semiconductor bodies are isolated electrically from one another.

It is only after application and testing of the first semiconductor body that the at least one conductor track may be closed to connect the first semiconductor body electrically to the second semiconductor body such that the pn-junctions of the semiconductor bodies connect in antiparallel to one another. In this way, the second semiconductor body does not disturb testing of the first semiconductor body for functionality.

I further provide an optoelectronic semiconductor component. The optoelectronic semiconductor component may be produced using the method described herein, i.e. all the features disclosed with regard to the method for producing the optoelectronic semiconductor component are also disclosed for the optoelectronic semiconductor component and vice versa.

The optoelectronic semiconductor component may comprise a connection carrier comprising electrical connection points and at least one conductor track.

Furthermore, the optoelectronic semiconductor component includes a first semiconductor body comprising a pn-junction and a second semiconductor body comprising a pn-junction. In this case, the first and second semiconductor bodies are preferably of identical structure. "Identical structure" means here that the semiconductor bodies comprise the same sequence of semiconductor layers, for example.

The first and second semiconductor bodies may be of identical thickness. The thickness is in this case measured in a vertical direction extending perpendicular to the lateral direction. "Identical thickness" is understood to mean an identical thickness achievable within the bounds of manufacturing tolerances during epitaxial deposition of the semiconductor layer stack. First and second semiconductor bodies of identical structure and thickness may, for example, be produced by lateral patterning of a semiconductor layer stack into a plurality of pairs of first and second semiconductor bodies.

The first and second semiconductor bodies may be applied to the connection carrier in the same orientation, i.e., for example, the n-conductive layer is arranged on the side of the respective semiconductor body remote from the connection carrier in the case of both semiconductor bodies. The p-conductive layer of the semiconductor bodies then in each case faces the connection carrier.

The first and second semiconductor bodies may connect electrically conductively with assigned electrical connection points and the first and second semiconductor bodies may connect together by the electrical connection points and/or the at least one conductor track such that the pn-junction of the first semiconductor body connects in antiparallel to the pn-junction of the second semiconductor body.

The semiconductor component may comprise a connection carrier comprising electrical connection points and/or at least one conductor track. The semiconductor component may further include a first semiconductor body comprising a pn-junction and a second semiconductor body comprising a pn-junction. The first semiconductor body and the second semiconductor body may be of identical structure and thickness. The first and second semiconductor bodies may connect conductively with assigned electrical connection points and connect together by the electrical connection points and/or the at least one conductor track of the connection carrier such that the pn-junction of the first semiconductor body is connected in antiparallel to the pn-junction of the second semiconductor body.

The first semiconductor body may be provided to generate electromagnetic radiation when the semiconductor component is in operation. For example, the first semiconductor body is a light-emitting diode chip.

The second semiconductor body may be provided as an ESD protection diode for the first semiconductor body.

The method described herein and the semiconductor component described herein are based inter alia on the following concept: with the above-described method it is possible, for example, to manufacture a light-emitting diode chip—the first semiconductor body—and an ESD protection diode—the second semiconductor body—on a single wafer. The ESD protection diode is here manufactured in parallel to the light-emitting diode chip. Apart from the lateral patterning of the semiconductor layer stack into first and second semiconductor bodies, no additional step is necessary, in comparison to conventional production of light-emitting diode chips. This makes it possible to produce an ESD protection diode which is particularly inexpensive to manufacture.

In addition, the ESD protection diode exhibits the same thickness as the light-emitting diode chip such that a particularly thin semiconductor component may be produced for which, for example, a particularly inexpensive connection carrier with a ceramic main body may be used.

Furthermore, the method described herein for producing a semiconductor component is distinguished in that testing of the light-emitting diode chip on the connection carrier can proceed without the ESD protection diode being connected, the first and second semiconductor bodies only being connected together after application of the semiconductor bodies to the connection carrier and testing thereof. In this way, it may be ensured that the presence of an ESD protection diode neither disturbs nor falsifies the measurement results from testing of the light-emitting diode chip, i.e. of the first semiconductor body.

The first semiconductor body may comprise a base area greater than the base area of the second semiconductor body. The base area is here measured, for example, using the area of the semiconductor bodies on the side thereof remote from the connection carrier in a plane parallel to the main direction of extension of the connection carrier. In particular, it is possible that the first and second semiconductor bodies differ mainly with regard to their different base areas.

The base area of the second semiconductor body may at most be 10% of the base area of the first semiconductor body, i.e. the second semiconductor body is significantly smaller than the first semiconductor body in terms of lateral extent. For example, the first semiconductor body may have a base area of 1 mm×1 mm. The second semiconductor body then may have a base area of 100 μm×60 μm, for example.

The first and second semiconductor bodies may have a thickness of at most 10 μm, for example, of approx. 6 μm. In other words, the semiconductor bodies are particularly thin, which may be achieved in that the substrate is detached completely from the semiconductor layer stack comprising the semiconductor bodies.

The first and second semiconductor bodies may be surface-mountable, wherein the first and second semiconductor bodies comprise contact points at their base area facing the connection carrier. For example, at least one via holes ("via" or "vias") may extend from the contact points into each of the first semiconductor body and the second semiconductor body, which via is provided, for example, to contact the p-conductive or the n-conductive region of the semiconductor body.

The first semiconductor body may comprise at its top remote from the connection carrier a radiation exit face through which passes a major part of the electromagnetic radiation generated by the first semiconductor body when in operation, wherein current distribution for feeding current to the pn-junction of the first semiconductor body takes place entirely below the radiation exit face. In other words, the top, remote from the connection carrier, of the first semiconductor body does not have arranged on it any contact points or current distributing tracks which could absorb or reflect emitted electromagnetic radiation, for example, light. The top of the semiconductor body is therefore free of metal coating. This is possible because current distribution proceeds below the radiation exit face.

At least one contact point of the first semiconductor body and/or of the second semiconductor body may connect to a connection point of the connection carrier via a conductor track of the connection carrier, which conductor track extends in places below the semiconductor body and in places is spaced laterally from the semiconductor body. In other words, by way of the conductor track of the connection carrier, a contact of the semiconductor body extends in the lateral direction in a region of the connection carrier not covered by the semiconductor body. This enables particularly simple contacting of the connection points of the connection carrier.

A plurality of pairs of first and second semiconductor bodies may connect together electrically conductively by conductor tracks of the connection carrier, i.e. the optoelectronic semiconductor component may comprise at least two pairs of first and second semiconductor bodies, the first semiconductor bodies connected together in series and the second semiconductor body of each first semiconductor body connected in antiparallel therewith. This results in a series connection of, for example, light-emitting diode chips, each safeguarded by their associated ESD protection diode. The individual first semiconductor bodies may interconnect by the conductor tracks of the connection carrier which, for example, connect together corresponding connection points of the connection carrier.

An electrically conductive layer may be arranged on the top, remote from the connection carrier, of the second semiconductor body. The electrically conductive layer increases the transverse conductivity of the p-conductive layer in the second semiconductor body. In this case, a via may extend through the n-conductive layer and the p-conductive layer of the second semiconductor body as far as the electrically conductive layer. The electrically conductive layer may be formed, for example, with a metal such as gold. The electrically conductive layer may in particular be radiation-opaque. In operation, no radiation is generated in the second semiconductor body 2 or radiation is advantageously prevented from exiting by the electrically conductive layer.

The method described herein and the semiconductor component described herein are explained in greater detail below with reference to examples and the associated drawings.

Identical, similar or equally acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

Figure 1A:
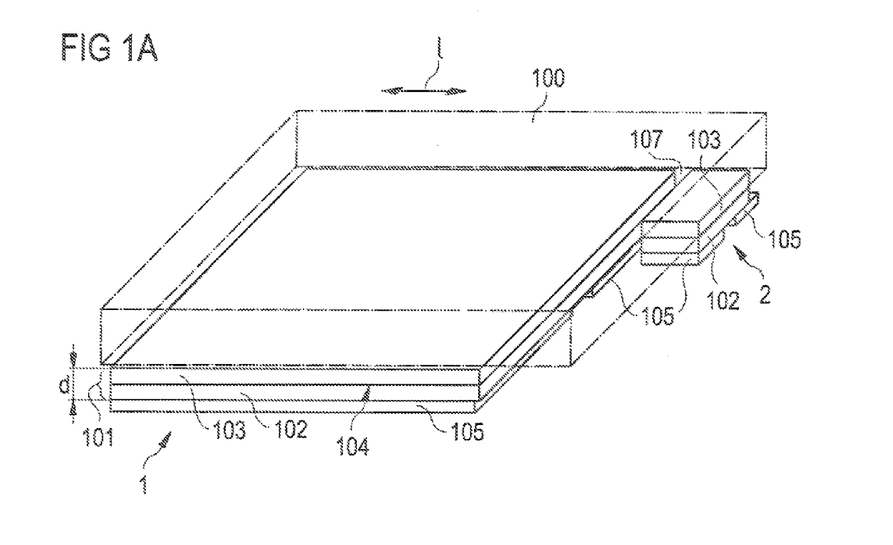
FIGS. 1A, 1B, 1C, 1D, 1E and 1F are schematic views of semiconductor bodies and portions of semiconductor bodies from examples of optoelectronic semiconductor components described herein.

FIG. 1A is a perspective view of a pair with a first semiconductor body 1 and a second semiconductor body 2 of an optoelectronic semiconductor component described herein, before the substrate 100 is detached. The semiconductor layer stack 101 is deposited epitaxially on the substrate 100, which comprises sapphire or silicon, for example. The semiconductor layer stack 101 comprises a p-conductive layer 102 and an n-conductive layer 103. Between the p-conductive layer and the n-conductive layer there is arranged the pn-junction 104 which, for example, comprises at least one region suitable to generate electromagnetic radiation.

The semiconductor layer stack is patterned in the lateral direction 1 into the first semiconductor body 1 and the second semiconductor body 2. The first semiconductor body 1 in this case has a base area at least ten times as large as the base area of the second semiconductor body.

First semiconductor body 1 and second semiconductor body 2 are separated from one another by a trench 107 extending from the side of the semiconductor layer stack 101 remote from the substrate 100 as far as the substrate 100.

On the side of the semiconductor layer stack 101 remote from the substrate 100, electrical contact points 105 are produced by patterning, for example, in the form of metal coatings. The contact points 105 serve in n- or p-side contacting of the semiconductor bodies 1, 2.

In the example of FIG. 1A, the second semiconductor body 2 is arranged outside the area of the first semiconductor body 1 at a lateral distance therefrom. The second semiconductor body 2 has a width of 60 µm and a length of 100 µm, for example. The first semiconductor body 1 may have a width and a length of, for example, in each case 1 mm.

In the finished optoelectronic semiconductor component, the first semiconductor body 1 acts as a light-emitting diode chip that generates electromagnetic radiation, for example, light. The second semiconductor body 2 serves as an ESD protection diode.

The first semiconductor body 1 and second semiconductor body 2 are configured jointly on the substrate 100 through formation of the layer stack 101 and therefore are of substantially identical thickness and composition. "Substantially" here means that the first and second semiconductor bodies may differ in composition and thickness due to production-related variations.

The thickness of the first and second semiconductor bodies, i.e. the thickness of the semiconductor layer stack 101, amounts, for example, to $d \leq 10$ µm, for example, $d=6$ µm.

Figure 1B:
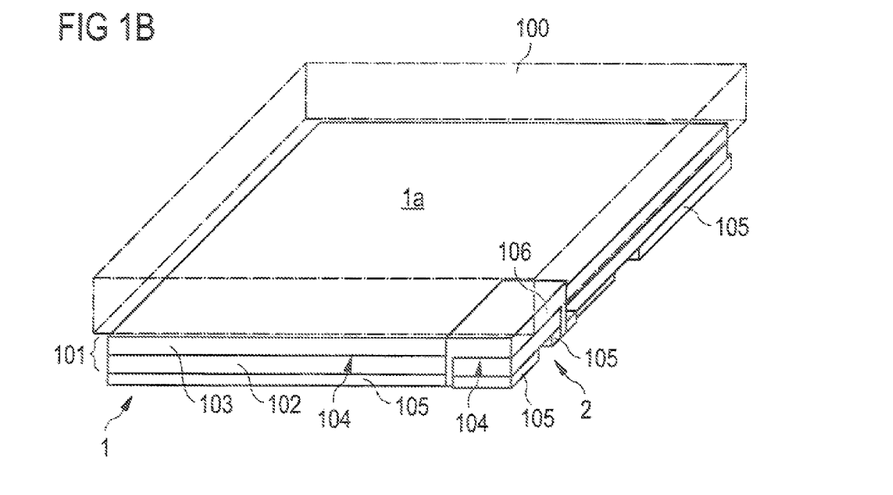

The schematic perspective representation of FIG. 1B shows a further pair of a first semiconductor body 1 and a second semiconductor body 2 for an example of an optoelectronic semiconductor component described herein. Unlike in the example of FIG. 1A, the second semiconductor body 2 is arranged in the area of the first semiconductor body 1. In this way as little material as possible of the epitaxially produced semiconductor layer stack is wasted. For better electrical isolation, the trench 107 between the first semiconductor body 1 and the second semiconductor body 2 is filled with the electrically insulating material 106, for example, silicon nitride and/or silicon dioxide.

Figure 1C:
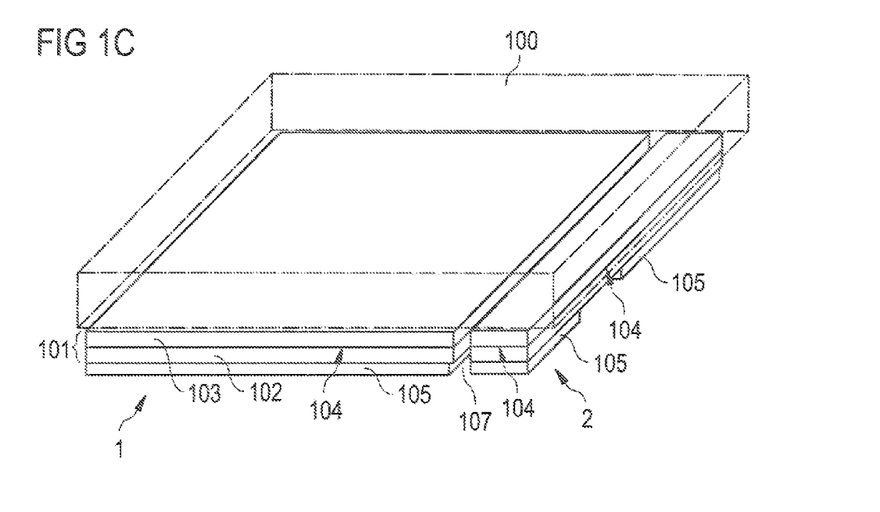

The schematic perspective representation in FIG. 1C shows a further example of the pair of first and second semiconductor bodies for an example of an optoelectronic semiconductor component described herein. In this example the second semiconductor body, separated from the first semiconductor body 101 by the trench 107, extends along the entire chip flank of the first semiconductor body 1. In this case, the second semiconductor body 2 may form a particularly resistant ESD protection diode for the first semiconductor body 1.

Figure 1D:
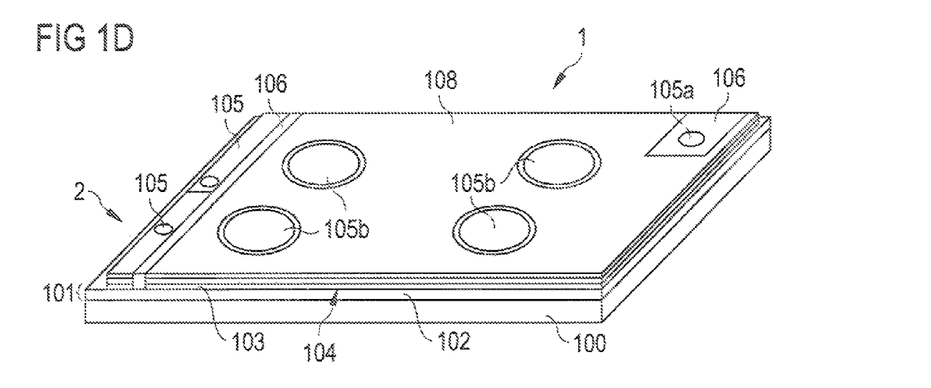

The schematic perspective representation of FIG. 1D shows an example of an example of the pair of first and second semiconductor bodies in greater detail. FIG. 1D shows a view of the side of the semiconductor body 1, 2 remote from the substrate 100. P-side contact points 105b are, for example, arranged in the region of the first semiconductor body 1. In a peripheral region of the first semiconductor body 1 it is possible to arrange a contact point 105a for n-side contacting. On its side remote from the substrate 100 the semiconductor body 1 may comprise a back metal coating 108 formed, for example, by the following layer sequence: Ti/Pt/Au. A layer sequence containing silver or consisting of silver and acting as a mirror may, for example, be arranged between the back metal coating 108 and the p-conductive region 102. The layer sequence is, for example, constructed as follows: Pt/Ag/Ti.

Figure 1E:
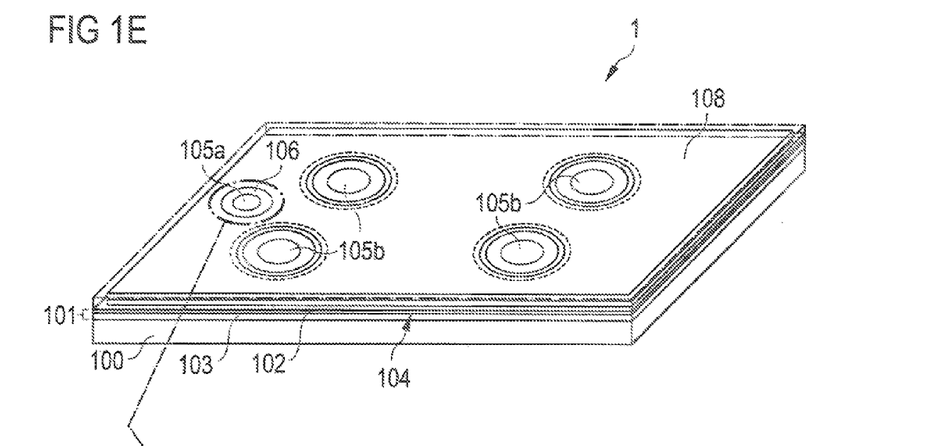
Figure 1F:
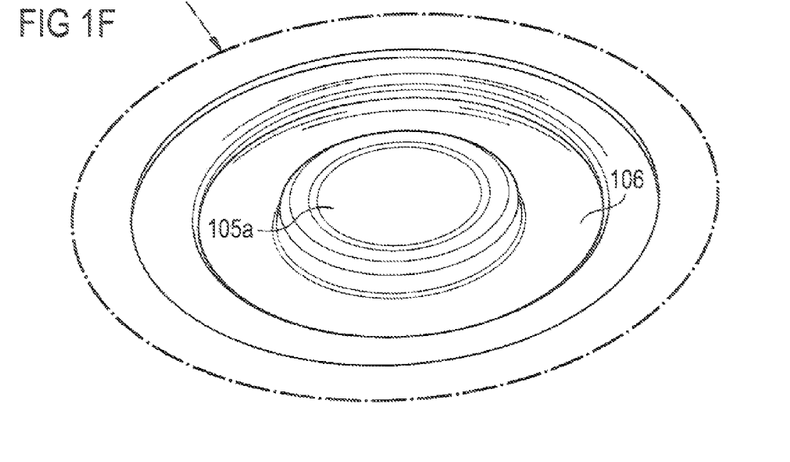

The schematic perspective representation in FIG. 1E shows in greater detail that the n-contact point 105a may, for example, take the form of a via through the p-conductive layer 102, the via being insulated from the rest of the semiconductor body with an electrically insulating material 106, for example, silicon dioxide (see in this respect also the enlarged detail in FIG. 1F).

Figure 2A:
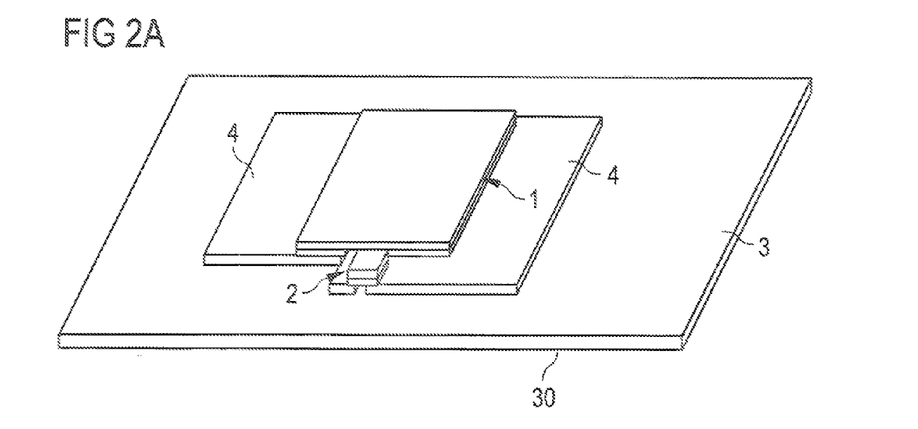
FIGS. 2A, 2B, 2C, 3A, 3B, 4A, 4B, 5A, 5B and 5C are schematic views of an example of an optoelectronic semiconductor component described herein.
Figure 2B:
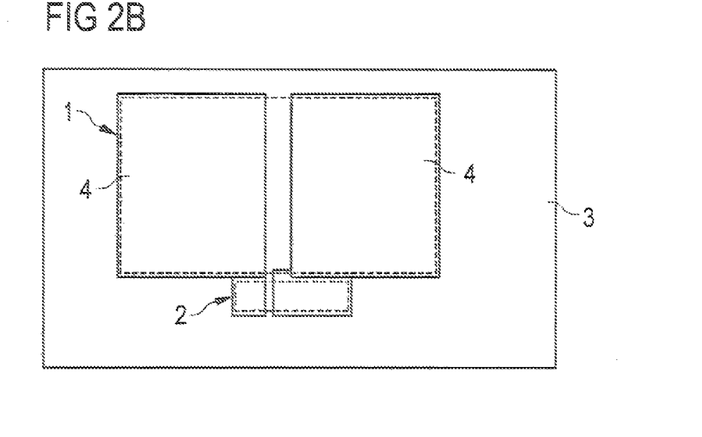
Figure 2C:
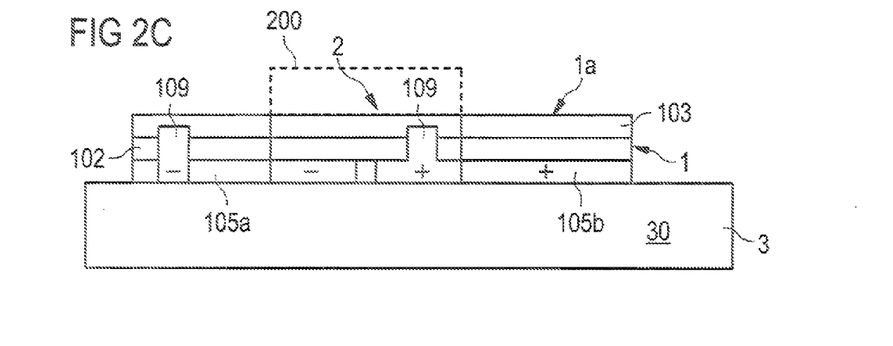

The schematic views in FIGS. 2A, 2B and 2C show in greater detail a first example of an optoelectronic semiconductor component described herein. For the optoelectronic semiconductor component use is made, for example, of a pair of first semiconductor bodies 1 and second semiconductor bodies 2, as described in relation to one of FIGS. 1A to 1F. The optoelectronic semiconductor component comprises a connection carrier 3. The connection carrier 3 comprises a ceramic main body 30 formed with a ceramic material. The ceramic material is, for example, silicon nitride, aluminium oxide or boron nitride.

In the example of FIGS. 2A and 2B, two connection points 4 are arranged on the side of the connection carrier 3 facing the semiconductor bodies 1, 2 (see in this respect in particular the schematic plan view of FIG. 2B). The semiconductor bodies 1, 2 are, for example, soldered onto the connection points 4. The semiconductor body 2 provided as an ESD protection diode is connects in antiparallel to the semiconductor body 1 provided to generate radiation, i.e. the pn-junctions 104 of the two semiconductor bodies 1, 2 connect in antiparallel to one another by way of the connection points 4 of the connection carrier 3.

In this case, the semiconductor bodies 1, 2 are applied to the connection carrier 3 in the same orientation, i.e. in both semiconductor bodies 1, 2, for example, the n-conductive layer 103 is directed away from the semiconductor body 3.

The schematic side view of FIG. 2C shows that a via 109 extends in the first semiconductor body 1 and in the second semiconductor body 2 in each case through the p-conductive layer 102 into the n-conductive layer 103. In this way, the first and second semiconductor bodies 1, 2 are surface-mountable.

The surfaces of the semiconductor bodies 1, 2 remote from the connection carrier 3 are free of contact points or electrical conductors.

As is apparent from FIG. 2C, however, an electrically conductive layer 200 may be arranged on the top, remote from the connection carrier 3, of the second semiconductor body 2. The electrically conductive layer 200 increases the transverse conductivity of the p-conductive layer 103 in the second semiconductor body 2. In this case, it is possible for the via 109 to extend as far as the electrically conductive layer 200. The electrically conductive layer 200 is formed, for example, with a metal such as gold. The electrically conductive layer 200 may in particular be radiation-opaque.

Figure 3A:
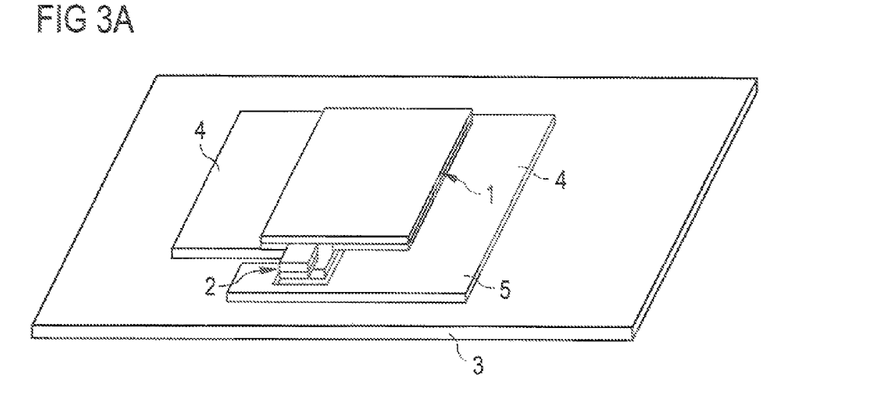
Figure 3B:
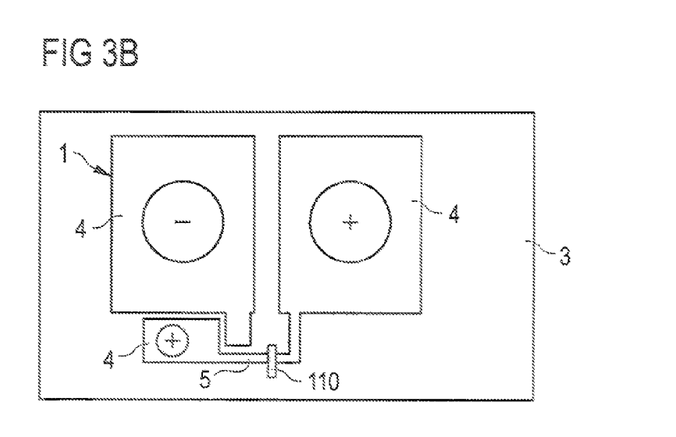

A further example of an optoelectronic semiconductor component described herein is explained in greater detail with reference to FIGS. 3A and 3B. Unlike in the example of FIGS. 2A and 2B, in this example the semiconductor bodies 1, 2 connect together in antiparallel by the connection points 4 and a conductor track 5 of the connection carrier 3. The conductor track 5 originally, i.e. directly after application of the semiconductor bodies 1, 2, comprises an interruption 110. In other words, the first semiconductor body 1 and the second semiconductor body 2 are not connected together in antiparallel directly after application thereof to the connection carrier 3. The second semiconductor body 2 therefore does not initially act as an ESD protection diode for the radiation-emitting semiconductor body 1. The semiconductor body 1 is tested for functionality in this state. After testing, the interruption 110 is closed, for example, by screen printing or dispensing an electrically conductive paste, i.e. after testing of the first semiconductor body 1, the first semiconductor body 1 and the second semiconductor body 2 connect together in antiparallel such that the second semiconductor body 2 can perform its function as an ESD protection diode for the first semiconductor body 1.

Figure 4A:
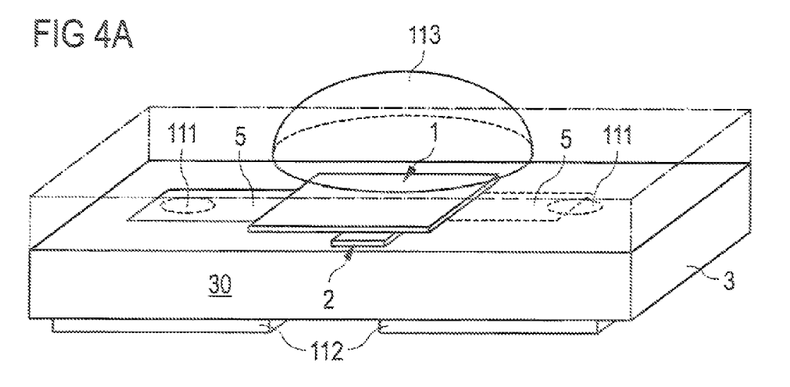
Figure 4B:
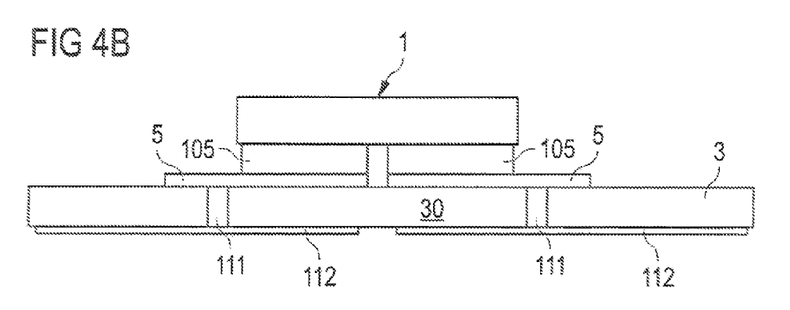

The schematic views of FIGS. 4A and 4B show a further example of an optoelectronic semiconductor component described herein. The optoelectronic semiconductor component described in FIGS. 4A and 4B is surface-mountable by the external connection points 112. Vias 111 are arranged in the main body 30 of the connection carrier 3, the vias connecting the top of the main body 30 with the semiconductor bodies 1, 2 to the bottom remote from the semiconductor bodies 1, 2. By the vias 111, an electrically conductive connection is produced between the external connection points 112 and the conductor tracks 5 on the top of the main body 30 of the connection carrier 3 (see in this respect in particular the schematic sectional representation of FIG. 4B).

The conductor tracks 5 connect electrically conductively with contact points 105 of the first semiconductor body 1 and of the second semiconductor body 2. The two semiconductor bodies connect together in antiparallel by way of the conductor tracks 5. The semiconductor bodies 1 are additionally surrounded in form-fitting manner by a radiation-transmissive encapsulation 113, which, for example, contains silicone and/or epoxide. The encapsulation 113 terminates flush with the main body 30 of the connection carrier 3 at the lateral side faces of the semiconductor component. In the region of the first semiconductor body 1 the encapsulation 113 may be curved convexly outwards, away from the connection carrier 3, in the manner of a lens to increase radiation exit efficiency.

Figure 5A:
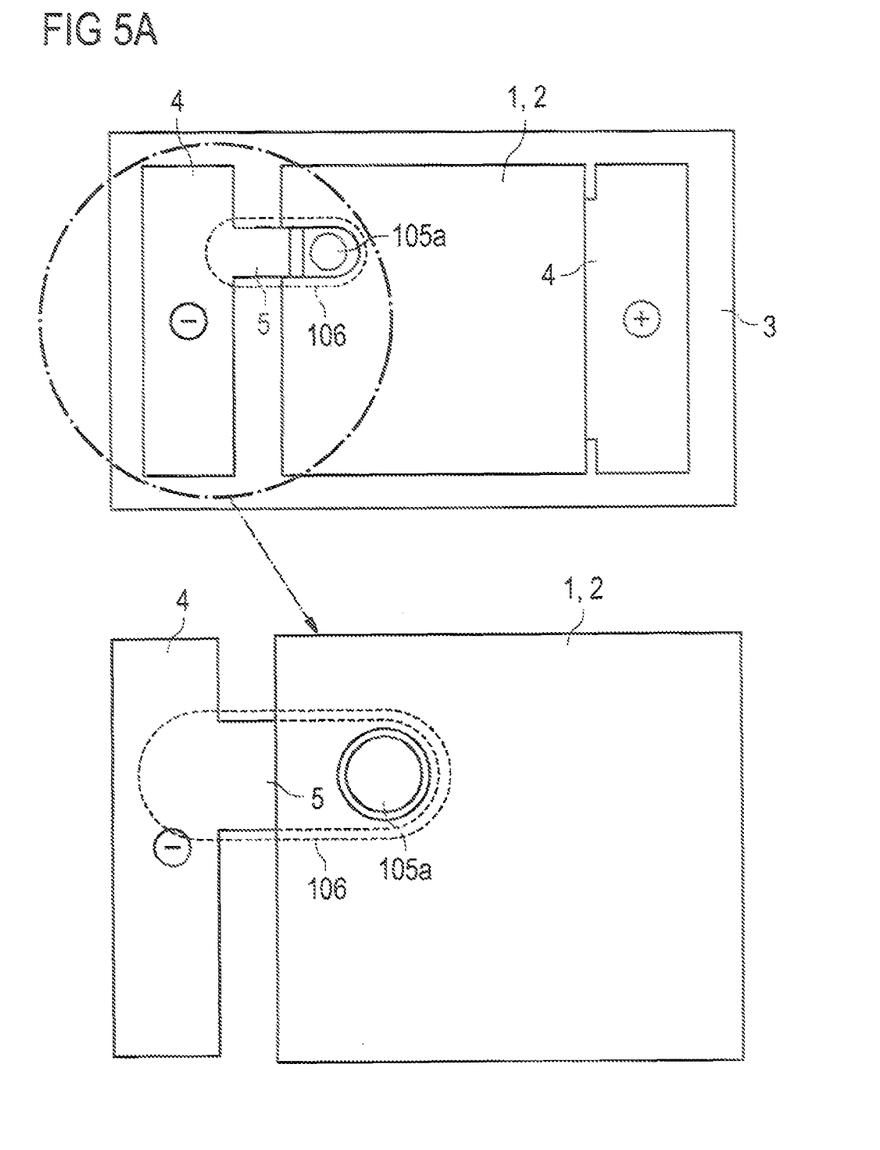
Figure 5B:
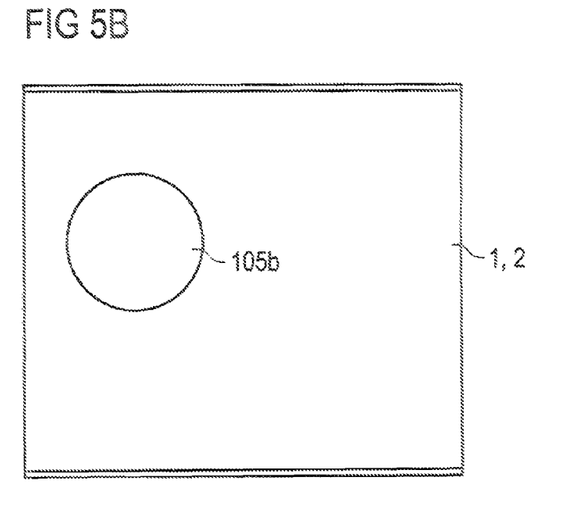
Figure 5C:
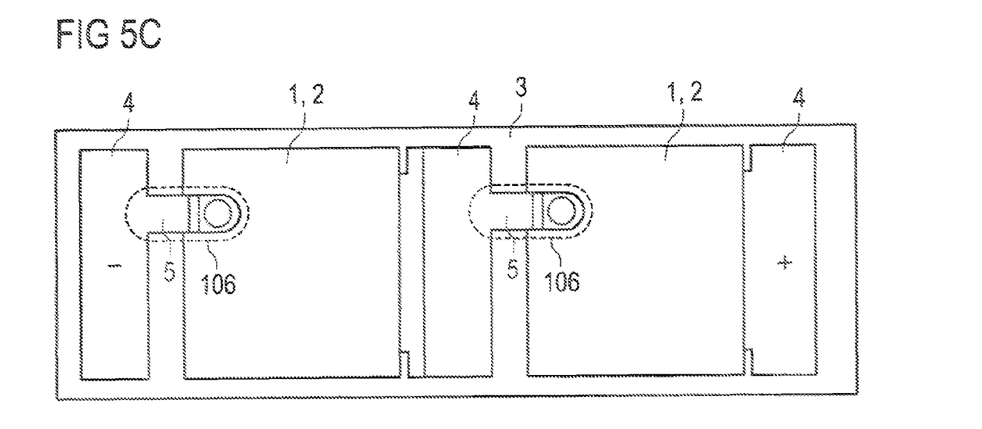

Further examples of optoelectronic semiconductor components described herein are explained in greater detail by schematic plan views and with reference to FIGS. 5A, 5B and 5C. A common feature of the examples is that, for example, the n-contact point 105a at least of the first semiconductor body 1 connects by a conductor track 5, which takes the form, for example, of metal coating, to an assigned connection point 4 of the connection carrier 3. The conductor track extends at least in places below the first semiconductor body 1, i.e. between the main body 30 of the connection carrier 3 and the bottom, facing the connection carrier 3, of the semiconductor body 1. An electrically insulating material 106, for example, a layer of silicon dioxide and/or silicon nitride, is arranged between the conductor track 5 and the semiconductor body 1.

FIG. 5B shows that the remaining bottom of the semiconductor body may then serve, for example, as a p-side contact point 105b. By the conductor track 5, contacting for the semiconductor body 1, 2 extends laterally outwards below the semiconductor body. As FIG. 5C shows, such an arrangement may be particularly well utilized for series connection of first semiconductor bodies 1 with antiparallel-connected second semiconductor bodies 2.

In all the examples it is also possible for the contact point 105b to form an n-side contact point and for the contact point 105a to form a p-side contact point.

All in all, the distinguishing features of an optoelectronic semiconductor component described herein are inexpensive production, its flat, space-saving construction and its versatility of use.

The description made with reference to selected examples does not restrict my components and methods to these examples. Rather, this disclosure encompasses any novel feature and any combination of features, including in particular any combination of features in the appended claims, even if the feature or combination is not itself explicitly indicated in the claims or examples.

The invention claimed is:

1. A method of producing an optoelectronic semiconductor component comprising:
    arranging a semiconductor layer stack with a pn-junction on a substrate,
    lateral patterning of the semiconductor layer stack into a plurality of pairs of first semiconductor bodies and second semiconductor bodies spaced from one another in a lateral direction,
    detaching the substrate from the pairs of first semiconductor bodies and second semiconductor bodies,
    applying at least one pair of first semiconductor bodies and second semiconductor bodies to a connection carrier comprising electrical connection points and/or at least one conductor track, and
    electrically connecting the semiconductor bodies of a pair of first semiconductor bodies and second semiconductor bodies by the at least one conductor track such that the pn-junction of the first semiconductor body connects in antiparallel to the pn-junction of the second semiconductor body,
    wherein after application of the semiconductor bodies, the conductor track comprises an interruption which is closed after testing for functionality of the first semiconductor body.

2. The method according to claim 1, wherein the substrate is detached after application of at least one pair of first semiconductor bodies and second semiconductor bodies to the connection carrier.

3. An optoelectronic semiconductor component comprising:
    a connection carrier comprising electrical connection points and/or at least one conductor track,
    a first semiconductor body comprising a pn-junction, and
    a second semiconductor body comprising a pn-junction, wherein
    the first semiconductor body and the second semiconductor body are of identical structure,
    the first semiconductor body and the second semiconductor body are of identical thickness,
    the first semiconductor body and the second semiconductor body connect conductively to assigned electrical connection points, and
    the first semiconductor body and the second semiconductor body connect by the electrical connection points and/or the at least one conductor track such that the pn-junction of the first semiconductor body connects in antiparallel to the pn-junction of the second semiconductor body, wherein the at least one conductor track comprises an interruption closed by an electrically conducting material.

4. The optoelectronic semiconductor component according to claim 3, wherein the first semiconductor body and the second semiconductor body are free of a growth substrate.

5. The optoelectronic semiconductor component according to claim 3, wherein
    the first semiconductor body generates electromagnetic radiation when the semiconductor component is in operation, and
    the first second semiconductor body is an ESD protection diode for the first semiconductor body.

6. The optoelectronic semiconductor component according to claim 3, wherein a base area of the first semiconductor body is larger than a base area of the second semiconductor body.

7. The optoelectronic semiconductor component according to claim 3, wherein the base area of the second semiconductor body amounts to at most 10% of the base area of the first semiconductor body.

8. The optoelectronic semiconductor component according to claim 3, wherein the first semiconductor body and the second semiconductor body have a thickness (d) of at most 10 µm.

9. The optoelectronic semiconductor component according to claim 3, wherein
the first semiconductor body and the second semiconductor body are surface-mountable, and
the first semiconductor body and the second semiconductor body comprise contact points at their base surfaces facing the connection carrier.

10. The optoelectronic semiconductor component according to claim 3, wherein the first semiconductor body comprises at its top remote form the connection carrier a radiation exit face through which passes a major part of electromagnetic radiation generated by the first semiconductor body when in operation, and current distribution for feeding current to the pn-junction of the first semiconductor body takes place entirely below the radiation exit face.

11. The optoelectronic semiconductor component according to claim 3, wherein, on its top remote from the connection carrier, the first semiconductor body is free of metal coatings, contact points and current distribution tracks.

12. The optoelectronic semiconductor component according to claim 3, wherein the connection carrier comprises a ceramic main body, to the outer faces of which the connection points and/or the at least one conductor track are applied as patterned metal coatings.

13. The optoelectronic semiconductor component according to claim 3, wherein at least one contact point of the first semiconductor body and/or of the second semiconductor body connects to a connection point of the connection carrier by a conductor track of the connection carrier, which conductor track extends in places below the semiconductor body and in places is spaced laterally from the semiconductor body.

14. The optoelectronic semiconductor component according to claim 3, having a plurality of pairs of first semiconductor bodies and second semiconductor bodies connected electrically conductively together by conductor tracks of the connection carrier.

15. The optoelectronic semiconductor component according to claim 3, wherein an electrically conductive and a metallic layer are arranged on top, remote from the connection carrier, of the second semiconductor body.

16. The optoelectronic semiconductor component according to claim 15, wherein the electrically conductive and metallic layer enhances transverse conductivity of the p-conductive layer in the second semiconductor body.

17. An optoelectronic semiconductor component comprising:
a connection carrier comprising electrical connection points and/or at least one conductor track,
a first semiconductor body comprising a p-conducting layer, an n-conducting layer and a pn-junction,
a second semiconductor body comprising a p-conducting layer, an n-conducting layer and a pn-j unction, and
a via within the first semiconductor body and a via within the second semiconductor body, wherein
to electrically contact the n-conductive layer, the via extends in the first semiconductor body and in the second semiconductor body in each case through the p-conductive layer into the n-conductive layer,
the first semiconductor body and the second semiconductor body are of identical structure,
the first semiconductor body and the second semiconductor body are of identical thickness,
the first semiconductor body and the second semiconductor body connect conductively to assigned electrical connection points, and
the first semiconductor body and the second semiconductor body connect by the electrical connection points and/or the at least one conductor track such that the pn-junction of the first semiconductor body connects in antiparallel to the pn-junction of the second semiconductor body.

18. The optoelectronic semiconductor component according to claim 15, wherein the first semiconductor body and the second semiconductor body are free of a growth substrate.

* * * * *

UNITED STATES PATENT AND TRADEMARK OFFICE
CERTIFICATE OF CORRECTION

PATENT NO. : 9,276,138 B2
APPLICATION NO. : 13/812880
DATED : March 1, 2016
INVENTOR(S) : Herrmann Page 1 of 1

It is certified that error appears in the above-identified patent and that said Letters Patent is hereby corrected as shown below:

In the claims

In column 10, at line 66, please delete "first" before "second semiconductor".

Signed and Sealed this
Sixteenth Day of August, 2016

Michelle K. Lee
*Director of the United States Patent and Trademark Office*